(12) United States Patent
Kwak

(10) Patent No.: US 7,592,982 B2
(45) Date of Patent: Sep. 22, 2009

(54) LIGHT EMITTING PANEL AND LIGHT EMITTING DISPLAY

(75) Inventor: Won-Kyu Kwak, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 670 days.

(21) Appl. No.: 11/112,797

(22) Filed: Apr. 21, 2005

(65) Prior Publication Data

US 2005/0243039 A1 Nov. 3, 2005

(30) Foreign Application Priority Data

Apr. 29, 2004 (KR) ................. 10-2004-0029944
Apr. 29, 2004 (KR) ................. 10-2004-0029945

(51) Int. Cl.
*G09G 3/30* (2006.01)
(52) U.S. Cl. ........................................ 345/76
(58) Field of Classification Search ............... 345/76, 345/82, 81; 313/506, 500; 257/59, 72, 347, 257/E21.166; 438/149, 479; 430/324; 315/169.3; 445/24
See application file for complete search history.

(56) References Cited

U.S. PATENT DOCUMENTS

| 6,421,033 | B1 | 7/2002 | Williams et al. | |
|---|---|---|---|---|
| 6,618,031 | B1 | 9/2003 | Bohn, Jr. et al. | |
| 7,329,985 | B2 * | 2/2008 | Yamazaki et al. | 313/506 |
| 7,330,168 | B2 * | 2/2008 | Anzai | 345/76 |
| 7,358,530 | B2 * | 4/2008 | Wong et al. | 257/59 |
| 7,411,586 | B2 * | 8/2008 | Kimura | 345/214 |
| 2001/0045944 | A1 | 11/2001 | Iwasaki | |
| 2004/0070557 | A1 | 4/2004 | Asano et al. | |

FOREIGN PATENT DOCUMENTS

| EP | 0 762 374 | 3/1997 |
|---|---|---|
| EP | 1 531 452 | 5/2005 |
| JP | 2001-109399 | 4/2001 |
| JP | 2002-236469 | 8/2002 |
| JP | 2002-318395 | 10/2002 |
| JP | 2004-109991 | 4/2004 |
| JP | 2004-117648 | 4/2004 |

OTHER PUBLICATIONS

N. Komiya et al, "Comparison of Vth compensation ability among voltage programming circuits for AMOLED panels"; IDW International Display Workshops Technical Digest, 2003, pp. 275-278.

(Continued)

*Primary Examiner*—Abbas I Abdulselam
(74) *Attorney, Agent, or Firm*—Christie Parker & Hale LLP

(57) ABSTRACT

A display device having components that are efficiently arranged in a pixel. A pixel circuit includes a capacitor for charging a voltage which corresponds to a data signal transmitted from a data line. A first transistor of the pixel circuit outputs a current corresponding to the voltage charged in the capacitor. A plurality of emit elements emit a light corresponding to the current outputted from the driving transistor. A plurality of emit control transistors are coupled between the first transistor and the plurality of emit elements. The emit control transistors include a plurality of semiconductor layers having inner resistances that are substantially the same as each other.

17 Claims, 7 Drawing Sheets

OTHER PUBLICATIONS

EPO Search Report, dated Sep. 21, 2005, for Application No. 05103365.2, in the name of Samsung SDI Co., Ltd.
Patent Abstracts of Japan, Publication No. 2001-109399; Date of Publication: Apr. 20, 2001; in the name of Tsutomu Yamada.
Patent Abstracts of Japan, Publication No. 2002-236469; Date of Publication: Aug. 23, 2002; in the name of Naoaki Furumiya.
Patent Abstracts of Japan, Publication No. 2002-318395; Date of Publication: Oct. 31, 2002; in the name of Jun Iba et al.
Patent Abstracts of Japan, Publication No. 2004-109991; Date of Publication: Apr. 8, 2004; in the name of Shoichira Matsumoto.
Patent Abstracts of Japan, Publication No. 2004-117648; Date of Publication: Apr. 15, 2004; in the name of Takayoshi Yoshida.

* cited by examiner

LIGHT EMITTING PANEL AND LIGHT EMITTING DISPLAY

CROSS REFERENCE TO RELATED APPLICATION

This application claims priority to and the benefit of Korean Patent Application No. 10-2004-0029944 filed on Apr. 29, 2004 and Korean Patent Application No. 10-2004-0029945 filed on Apr. 29, 2004 in the Korean Intellectual Property Office, the entire contents of both of which are incorporated herein by reference.

BACKGROUND OF THE INVENTION (a) Field of the Invention

The present invention relates to a display device. More particularly, the present invention relates to an organic electroluminescent display using electroluminescence (hereinafter, 'EL') of organic materials.

(b) Description of the Related Art

In general, an organic electroluminescent (EL) display electrically excites a phosphorous organic compound to emit light. The organic emitting elements (or organic emitting cells) are arranged in an n×m matrix format to configure an organic EL display panel which displays image data by voltage- or current-driving.

The organic emit element has diode properties, and thus is also referred to as an organic light emitting diode (OLED). The organic emit element includes an anode (ITO), an organic thin film, and a cathode layer (metal). The organic thin film has a multi-layer structure including an emitting layer (EML), an electron transport layer (ETL), and a hole transport layer (HTL) for maintaining balance between electrons and holes and improving emitting efficiencies. Further, the organic emitting element includes an electron injecting layer (EIL) and a hole injecting layer (HIL). The organic emitting elements are arranged in an n×m matrix format to configure an organic EL display panel.

Methods for driving the organic EL display panel include a passive matrix method, and an active matrix method which uses thin-film transistors (TFTs). The passive matrix method includes forming anodes and cathodes to cross (or cross over) with or to be substantially perpendicular to each other, selecting lines, and driving the organic EL display panel. The active matrix method includes orderly turning on of a plurality of TFTs which are respectively coupled to data lines and scan lines according to signals for selecting the scan lines and driving the organic EL display panel.

Hereinafter, a pixel circuit of a general active matrix organic EL display is described.

FIG. 1 shows a pixel circuit, one of n×m pixels, which is located at a first row and a first column.

As shown in FIG. 1, one pixel 10 includes three sub pixels 10r, 10g, and 10b, which respectively include organic EL elements OLEDr, OLEDg, and OLEDb for respectively emitting a red light (R), a green light (G), and a blue light (B). Further, in the structure the sub pixels are arranged in a stripe format, and the sub pixels 10r, 10g, and 10b are coupled to separate data lines D1r, D1g, and D1b and to a common scan line S1.

The red color sub pixel 10r includes two transistors M11r and M12r and a capacitor C1r for driving the organic EL element OLEDr. In the same manner, the green color sub pixel 10g includes two transistors M11g and M12g and a capacitor C1g for driving the organic EL element OLEDg, and the blue color sub pixel 10b includes two transistors M11b and M12b and a capacitor C1b for driving the organic EL element OLEDb. Since the connections and operations of the sub pixels 10r, 10g, and 10b are substantially the same, only the connection and operation of the sub pixel 10r will now be described as an example.

The driving transistor M11r is coupled between a power supply source voltage VDD and an anode of the organic EL element OLEDr, and transmits a current for emitting light to the organic EL element OLEDr. A cathode of the organic EL element OLEDr is coupled to a voltage VSS which is lower than the power supply source voltage VDD. The amount of the current flowing in the driving transistor M11r is controlled by a data voltage applied through the switching transistor M12r. The capacitor C1r is coupled between a source and a gate of the transistor M11r and controls applied voltage during a predetermined period. A scan line S1 for transmitting an on/off selection signal is coupled to a gate of the transistor M12r, and a data line D1r for transmitting a data voltage corresponding to the red color sub pixel 10r is coupled to a source of the transistor M12r.

Here, the switching transistor M12r is turned on in response to a select signal which is applied to the gate. Then, the data voltage $V_{DATA}$ is applied to the gate of the transistor M11r from the data line D1r through the transistor M12r. Then, a current $I_{OLED}$ flows to (and/or through) the transistor M11r corresponding to a voltage $V_{GS}$ which is charged between the gate and source of the transistor M11r by the capacitor C1r. The organic EL element OLEDr emits red light corresponding to the current $I_{OLED}$. The current flowing to the organic EL element OLEDr is calculated as given in the following Equation 1.

$$I_{OLED} = \frac{\beta}{2}(V_{GS} - V_{TH})^2 = \frac{\beta}{2}(V_{DD} - V_{DATA} - |V_{TH}|)^2 \quad \text{[Equation 1]}$$

Here, $V_{TH}$ is a threshold voltage of the transistor M11r, and β is a constant.

As represented by Equation 1, a current corresponding to a data voltage is supplied to an organic EL element OLEDr in the pixel circuit shown in FIG. 1, and the organic EL element OLEDr emits a red light to brightness corresponding to the supplied current. Here, the supplied data voltage has multi-stage voltage values in a predetermined range to display a certain gray scale.

As such, in the organic EL display, one pixel 10 includes three subpixels 10r, 10g, and 10b, and each sub pixel includes a driving transistor, M11r, M11g or M11b, a switching transistor, M12r, M12g or M12b, and a capacitor, C1r, C1g or C1b, for driving the organic EL element, OLEDr, OLEDg or OLEDb. Further, each sub pixel is coupled to a data line for transmitting a data signal and a power line for transmitting a power supply source voltage $V_{DD}$.

Therefore, many lines for transmitting voltages and signals to a transistor and a capacitor are required to be located in each pixel, and there is difficulty to arrange all the lines within one pixel.

SUMMARY OF THE INVENTION

In exemplary embodiments of the present invention, there is provided a light emitting display having components that are efficiently arranged in a pixel.

To address the above referenced and other features, according to one aspect of the present invention, is provided a display device including a plurality of scan lines for transmitting select signals, a plurality of data lines for transmitting data signals, and a plurality of pixel circuits coupled to the scan lines and the data lines. Here, at least one of the pixel circuits includes a capacitor, a driving transistor, a plurality of emit elements, and a plurality of emit control transistors. The capacitor charges a voltage which corresponds to one of the data signals transmitted from a corresponding one of the data lines. The driving transistor outputs a current corresponding to the voltage charged in the capacitor. The plurality of emit elements emit a light corresponding to the current outputted from the driving transistor. The plurality of emit control transistors are coupled between the driving transistor and the plurality of emit elements. Here, the emit control transistors include a plurality of semiconductor layers having inner resistances that are substantially the same as each other.

Further, a ratio of a length and a width of each of the semiconductor layers may be substantially the same as those of other ones of the semiconductor layers, and two emit elements among the plurality of emit elements can respectively emit one light among a red light, a green light, and a blue light, in response to the current outputted from the driving transistor.

The length of each of the semiconductor layers forming a corresponding one of the emit control transistors may include a length of a source area, a length of a channel area, and a length of a drain area of the corresponding one of the emit control transistors. The width of each of the semiconductor layers forming the corresponding one of the emit control transistors can be measured in a direction that is substantially perpendicular to a direction in which the length of the semiconductor layer is measured.

Further, at least two semiconductor layers among the plurality of semiconductor layers may be arranged substantially parallel to each other.

According to another aspect of the present invention, is provided a display device including a plurality of scan lines for transmitting select signals, a plurality of data lines for transmitting data signals, and a plurality of pixel circuits coupled to the scan lines and the data lines. Here, at least one of the pixel circuits arranged in a pixel area includes first, second, and third emit elements, first, second and third semiconductor layers, and first, second and third control electrode lines. The first, second and third emit elements include pixel electrodes to which a current is applied, for emitting light corresponding to the applied current. The first, second, and third semiconductor layers are respectively coupled to pixel electrodes of the first, second, and third emit elements through first, second, and third contact holes. The first, second, and third control electrode lines are insulated and cross the first, second, and third semiconductor layers, and are substantially parallel to each other. Ratios of a length and a width of the first semiconductor layer, the second semiconductor layer, and the third semiconductor layer are substantially the same as each other.

The first semiconductor layer may form a first emit control transistor having an insulated channel area which crosses the first control electrode line, the second semiconductor layer may form a second emit control transistor having an insulated channel area which crosses the second control electrode line, and the third semiconductor layer may form a third emit control transistor having an insulated channel area which crosses the third control electrode line.

Further, the length of each of the first, second, and third semiconductor layers may include a length of a source area, a length of the channel area, and a length of a drain area of a corresponding one of the first, second, and third emit control transistors. The width of each of the first, second, and third semiconductor layers may be measured in a direction substantially perpendicular to a direction in which the length of the corresponding one of the first, second, and third semiconductor layers is measured.

According to another aspect of the present invention, is provided a display device including a plurality of scan lines for transmitting select signals, a plurality of data lines for transmitting data signals, and a plurality of pixel circuits coupled to the scan lines and the data lines. Here, at least one of the pixel circuits includes a first capacitor, a first transistor, first, second and third emit elements, and first, second and third emit control transistors. The first capacitor charges a voltage which corresponds to one of the data signals transmitted from a corresponding one of the data lines. The first transistor outputs a current which corresponds to the voltage charged in the first capacitor. The first, second, and third emit elements emit a light corresponding to the current outputted from the first transistor, and the first, second, and third emit control transistors are respectively coupled between the first transistor and the first, second, and third emit elements. Here, the first semiconductor layer forming the first emit control transistor is arranged generally symmetrically with the second semiconductor layer forming the second emit control transistor with respect to the third semiconductor layer forming the third emit control transistor.

At least two semiconductor layers among the first, second, and third semiconductor layers may be substantially parallel to each other, and the first, second, and third semiconductor layers forming the first, second, and third emit elements may be doped with the same type of impurities.

Here, the at least one of the pixel circuits can further include a second transistor, a third transistor and a second capacitor. The second transistor may be coupled between a control electrode of the first transistor and a node between the first transistor and the first, second and third emit control transistors. The third transistor may have a first electrode coupled to a first electrode of the first capacitor and a second electrode coupled to a second electrode of the first capacitor. The second capacitor may have a first electrode coupled to the second electrode of the third transistor and a second electrode coupled to the control electrode of the first transistor.

According to another aspect of the present invention, is provided a display device including a plurality of scan lines for transmitting select signals, a plurality of data lines for transmitting data signals, and a plurality of pixel circuits coupled to the scan lines and the data lines and arranged in an array format. Here, at least one of the pixel circuits arranged in a pixel area includes first, second and third emit elements, semiconductor layers, and first, second and third control electrode lines. The first, second, and third emit elements include pixel electrodes to which a current is applied, for emitting light corresponding to the applied current. The semiconductor layers include a first semiconductor layer area coupled to a pixel electrode of the first emit element through a first contact hole, a second semiconductor layer area coupled to a pixel electrode of the second emit element through a second contact hole, and a third semiconductor layer area coupled to a pixel electrode of the third emit element through a third contact hole. The first, second, and third control electrode lines are insulated, cross the semiconductor layers and are substantially parallel to each other. Here, the first semiconductor layer area is arranged generally symmetrically with the third semiconductor layer area with respect to the second semiconductor layer area.

Here, at least one semiconductor layer area among the first, second, and third semiconductor layer areas may be substantially parallel to at least one of the data lines.

At least one semiconductor layer area among the first, second, and third semiconductor layer areas may be substantially parallel to at least one of the scan lines.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

Figure 1:
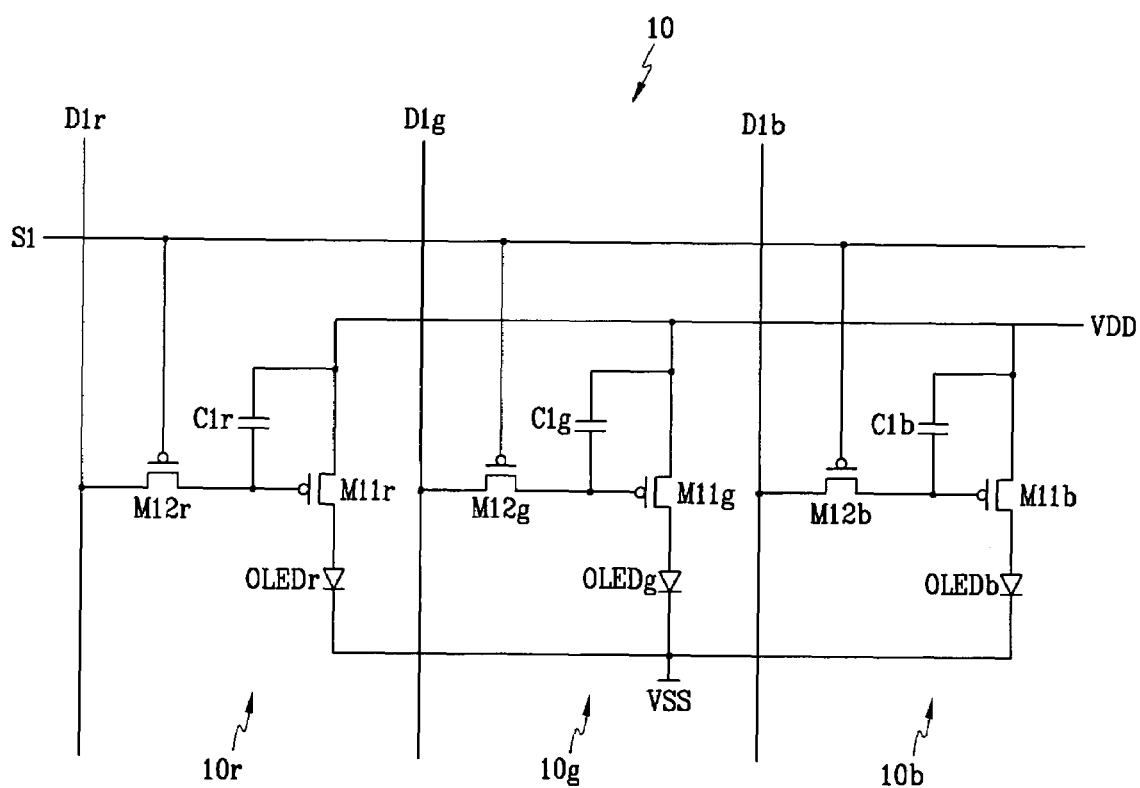
FIG. 1 shows a pixel circuit of a conventional light emitting display panel.

In the following detailed description, only certain exemplary embodiments of the present invention are shown and described, simply by way of illustration. As those skilled in the art would recognize, the described exemplary embodiments may be modified in various ways, all without departing from the spirit or scope of the present invention. Accordingly, the drawings and description are to be regarded as illustrative in nature, and not restrictive.

There may be parts shown in the drawings, or parts not shown in the drawings, that are not discussed in the specification as they are not essential to a complete understanding of the invention. Like reference numerals designate like elements. The thickness is magnified to more clearly show several layers and areas in the drawings. When a layer, a membrane, a board, etc., is described to be located 'on' another part, it is understood that a further part can be located therebetween.

In addition, several terms for scan lines are defined. "A present scan line" refers to a scan line transmitting a present selection signal, and "a previous scan line" refers to a scan line that transmitted a selection signal before the present selection signal.

Further, "a present pixel" refers to a pixel emitting light on the basis of a selection signal of the present scan line, "a previous pixel" refers to a pixel emitting light on the basis of a selection signal of the previous scan line, and "a next pixel" refers to a pixel emitting light on the basis of a selection signal of the next scan line.

Figure 2:
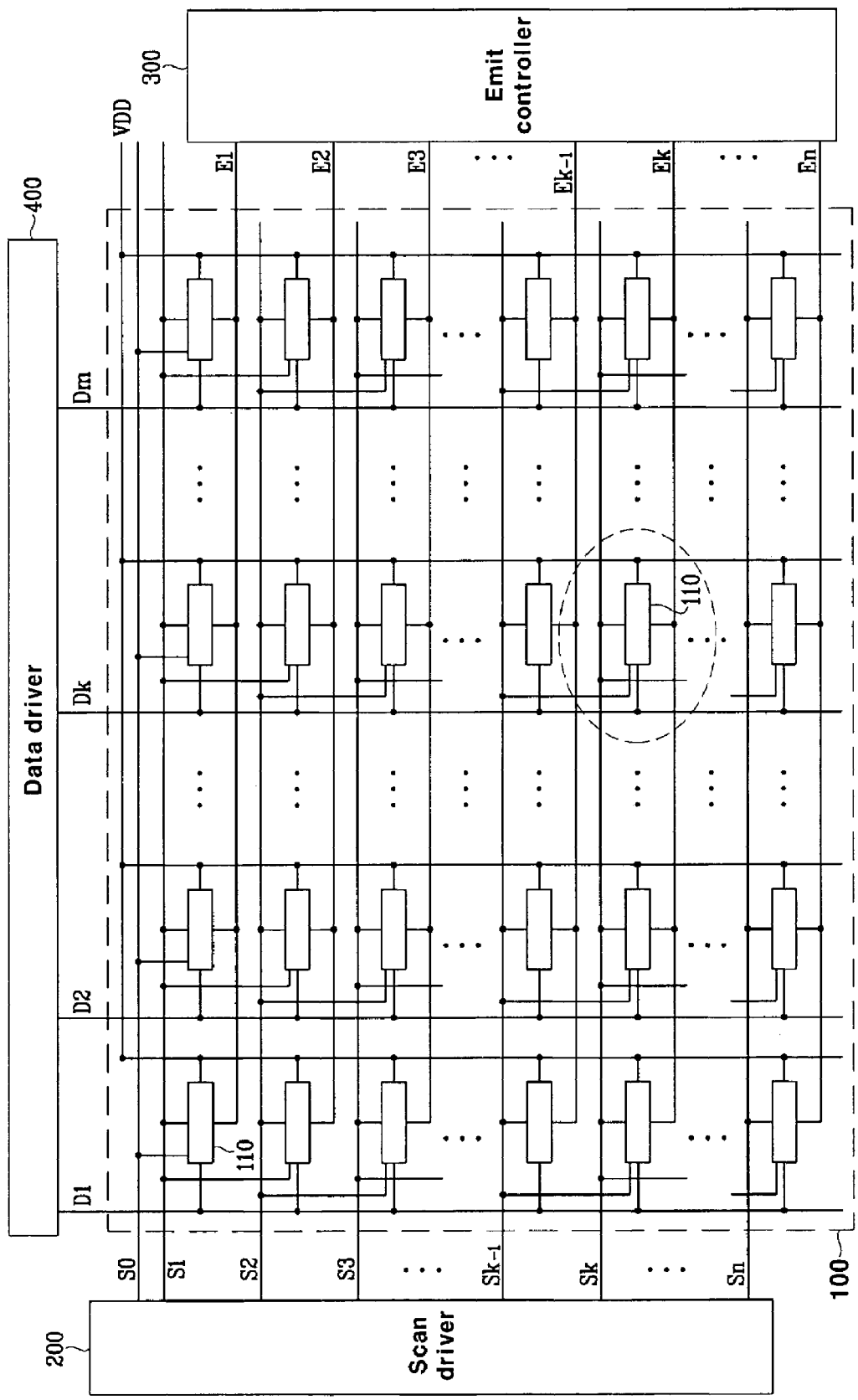
FIG. 2 is a schematic diagram of an organic EL display according to an exemplary embodiment of the present invention.
Figure 3:
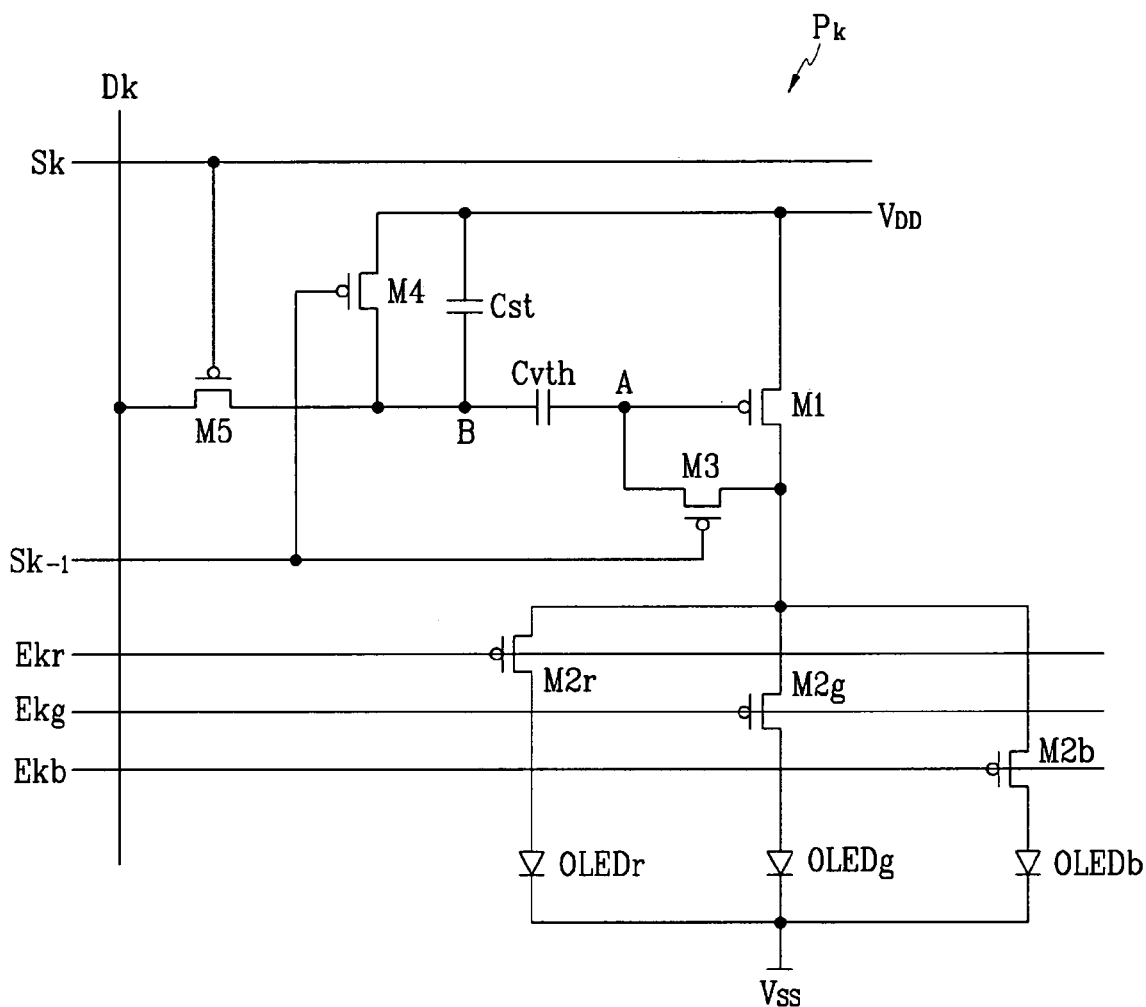
FIG. 3 shows an equivalent circuit of a pixel circuit according to an exemplary embodiment of the present invention.

As shown in FIG. 2, the organic EL display according to an exemplary embodiment of the present invention includes a display panel 100, a scan driver 200, an emit controller 300, and a data driver 400. The display panel 100 includes a plurality of scan lines S0, S1, ... Sk ... Sn and a plurality of emit control lines E1, ... Ek ... En arranged in the row direction, a plurality of data lines D1 ... Dk ... Dm and a plurality of power lines for applying power supply source voltage VDD arranged in the column direction and a plurality of pixels 110. Each of the pixels 110 is formed at a pixel area defined or surrounded by any two scan lines Sk-1 and Sk and any two neighboring data lines Dk-1 and Dk, and the pixels 110 are driven according to a signal transmitted from the present scan line Sk, the previous scan line Sk-1, the emit control line Ek, and the data line Dk. Further, each of the emit control lines E1 to En is composed of three emit control lines (e.g., E1 includes E1$r$, E1$g$ and E1$b$, En includes En$r$, En$g$ and En$b$, and Ek includes Ek$r$, Ek$g$ and Ek$b$ as shown in FIG. 3).

The scan driver 200 sequentially applies the select signals for selecting corresponding lines to the scan lines S0 to Sn such that the data signals can be applied to the pixels of the corresponding lines. The emit controller 300 sequentially applies the emit control signals for controlling emission of the organic EL elements OLEDr, OLEDg, and OLEDb shown in FIG. 3 to the emit control lines E1 to En. The data driver 400 applies the data signals corresponding to the pixels of the lines to which the selection signals are applied, to the data lines D1 to Dm, whenever the selection signals are sequentially applied.

The scan driver 200, the emit controller 300, and the data driver 400 can be coupled to the substrate on which the display panel 100 is formed. Alternatively, the scan driver 200, the emit controller 300, and/or the data driver 400 can be directly formed on the glass substrate of the display panel 100. Further, a driving circuit composed of the scan lines, the data lines, and transistors can be formed on the substrate of the display panel 100. Further, the scan driver 200, the emit controller 300, and/or the data driver 400 can be adhered and be coupled to the substrate of the display panel 100, as a tape carrier package (TCP), flexible printed circuit (FPC), or tape automatic bonding (TAB), etc.

In exemplary embodiments of the present invention, one field can be divided into three subfields which are then driven. Red, green, and blue color data are applied and red, green, and blue lights are emitted at the three subfields. Here, the scan driver 200 sequentially applies the select signals to the scan lines S0 to Sn at each subfield. The emit controller 300 sequentially applies the emit control signals to the emit control lines E1 to En such that each color organic EL element is emitted at each one subfield. The data driver 400 applies the data signals corresponding to red, green, and blue organic EL elements to the data lines D1 to Dm at three subfields.

Hereinafter, the detailed operation of the organic EL display according to an exemplary embodiment of the present invention will be described in detail with reference to FIG. 3.

FIG. 3 shows an equivalent circuit of one pixel 110 in the organic EL display of FIG. 2. In FIG. 3, for example, a pixel Pk coupled to any $k_{th}$ row of scan line Sk, and $k_{th}$ column of data line Dk is described, and all transistors are p channel transistors.

As shown in FIG. 3, the pixel circuit according to the exemplary embodiment of the present invention includes a driving transistor M1, a diode transistor M3, a capacitor transistor M4, a switching transistor M5, three organic EL elements OLEDr, OLEDg, and OLEDb, and three emit control transistors M2$r$, M2$g$, and M2$b$ for controlling the emission of three organic EL elements OLEDr, OLEDg, and OLEDb, and two capacitors Cst and Cvth. An emit control line Ek is composed of three emit control lines Ek$r$, Ek$g$, and Ek$b$. The emit control transistors M2$r$, M2$g$, and M2$b$ respond to the emitting control signals transmitted through the emit control lines Ek$r$, Ek$g$, and Ek$b$, respectively, and selectively transmit the current transmitted from the driving transistor M1 to the organic EL elements OLEDr, OLEDg, and OLEDb.

In detail, the transistor M5, of which the gate is coupled to the present scan line Sk and the source is coupled to the data line Dk, responds to the selection signal transmitted from the scan line Sk and transmits the data voltage applied from the data line Dk to a first electrode or node B of the capacitor Cvth. The transistor M4 responds to the selection signal transmitted from the previous scan line Sk-1 and couples the node B of the capacitor Cvth to the power supply source VDD. The transistor M3 is coupled between a second electrode or a node A of the capacitor Cvth and a drain of the transistor M1. The transistor M3 is turned on in response to the selection signal transmitted from the previous scan line Sk-1 such that the transistor M1 is diode-connected. The driving transistor M1, for driving the organic EL element OLED (e.g., OLEDr, OLEDg and/or OLEDb), has its gate coupled to the node A of the capacitor Cvth, and its source coupled to the power supply source VDD. The driving transistor M1 controls the current that is applied to the organic EL element OLED according to the voltage that is applied to the gate.

Further, a first electrode of the capacitor Cst is coupled to the power supply source VDD, and a second electrode of the capacitor Cst is coupled to the drain of the transistor M4 at or about the node B, and the first electrode of the capacitor Cvth is coupled to the second electrode of the capacitor Cst such that the two capacitors are coupled in series, and the second electrode of the capacitor Cvth is coupled to the gate of the driving transistor M1 at or about the node A.

The drain of the driving transistor M1 is coupled to the sources of the emit control transistors M2r, M2g, and M2b, and gates of the transistors M2r, M2g, and M2b are respectively coupled to the emit control lines Ekr, Ekg and Ekb. Drains of the emit control transistors M2r, M2g, and M2b are respectively coupled to anodes of organic EL elements OLEDr, OLEDg, and OLEDb. A power supply source $V_{SS}$ having a voltage level lower than that of the power supply source $V_{DD}$ is applied to the cathodes of the organic EL elements OLEDr, OLEDg, and OLEDb. A negative voltage or ground voltage can be used for the power supply source $V_{SS}$.

When a low level scan voltage is applied to the previous scan line Sk-1, the transistors M3 and M4 are turned on. When the transistor M3 is turned on, the transistor M1 comes to be in a diode-connected state. Thus, the voltage difference between the gate and source of the transistor M1 is changed until the voltage difference becomes a threshold voltage Vth of the transistor M1. At this time, since the source of the transistor M1 is coupled to the power supply source $V_{DD}$, a sum of the power supply source voltage $V_{DD}$ and the threshold voltage Vth is applied to the gate of the transistor M1, that is, at or about the node A of the capacitor Cvth. Further, when the transistor M4 is turned on and the power supply source voltage VDD is applied to the node B, the voltage $V_{Cvth}$ charged at the capacitor Cvth can be calculated as given in the following Equation 2.

$$V_{Cvth} = V_{CvthA} - V_{CvthB} = (VDD+Vth)31\ VDD = Vth \quad \text{[Equation 2]}$$

Here, $V_{Cvth}$ refers to a voltage that is charged at the capacitor Cvth, $V_{CvthA}$ refers to a voltage that is applied to the node A of the capacitor Cvth, and $V_{CvthB}$ refers to a voltage that is applied to the node B of the capacitor Cvth.

When the low level scan voltage is applied to the present scan line Sk, the transistor M5 is turned on, and the data voltage Vdata is applied to the node B. Further, since the voltage corresponding to the threshold voltage Vth of the transistor M1 is charged at the capacitor Cvth, a voltage corresponding to the sum of the data voltage Vdata and the threshold voltage Vth is applied to the gate of the transistor M1. That is, the voltage Vgs between the gate and source of the transistor M1 can be calculated as given in the following Equation 3. Here, a high-level signal is applied to the emit control line Ek (e.g., Ekr, Ekg and/or Ekb), and the transistor M2 (e.g., M2r, M2g and/or M2b) is turned off to block a current flow.

$$Vgs = (Vdata + Vth) - VDD \quad \text{[Equation 3]}$$

Next, the transistor M2 is turned on in response to a low-level signal from the emit control line Ek. Thus, the current $I_{OLED}$ corresponding to the gate-source voltage Vgs of the transistor M1 is supplied to the organic EL element through the transistor M2, and the organic EL element OLED (e.g., OLEDr, OLEDg, and/or OLEDb) is emitted. The current $I_{OLED}$ can be calculated as in the following Equation 4.

$$I_{OLED} = \frac{\beta}{2}(Vgs - Vth)^2 = \frac{\beta}{2}((Vdata+Vth-VDD)-Vth)^2 = \frac{\beta}{2}(VDD-Vdata)^2 \quad \text{[Equation 4]}$$

Here, $I_{OLED}$ indicates a current flowing into the organic EL element OLED, $V_{GS}$ indicates a voltage between the source and the gate of the transistor M1, Vth indicates a threshold voltage of the transistor M1, Vdata indicates a data voltage, and β indicates a constant.

When the data voltage Vdata is a red data signal, and the emit control transistor M2r is turned on in response to the low-level emit control signal transmitted from the emit control line Ekr, the current $I_{OLED}$ is transmitted to the red organic EL element OLEDr and the emission of red light occurs.

In the same manner, when the data voltage Vdata is a green data signal, and the emit control transistor M2g is turned on in response to the low-level emit control signal transmitted from the emit control line Ekg, the current $I_{OLED}$ is transmitted to the green organic EL element OLEDg and the emission of green light occurs. Further, when the data voltage Vdata is a blue data signal, and the emit control transistor M2b is turned on in response to the low-level emit control signal transmitted from the emit control line Ekb, the current $I_{OLED}$ is transmitted to the blue organic EL element OLEDb and the emission of blue light occurs. Three emit control signals that are applied to three emit control lines respectively have low level periods that are not overlapped with each other during one field, such that one pixel can display red, green, and blue colors.

Next, in an organic EL display according to a first exemplary embodiment of the present invention, an arrangement structure in a pixel area where a pixel circuit is arranged is described in detail with reference to FIG. 4, FIG. 5, and FIG. 6. Here, reference numerals are provided to the components of the present pixel Pk, and the same reference numerals are provided to the components of the previous pixel Pk-1, except that an apostrophe symbol ("'") is added to the reference numerals. The apostrophe symbol ("'") is used to distinguish the components of the present pixel from the components of the previous pixel.

Figure 4:
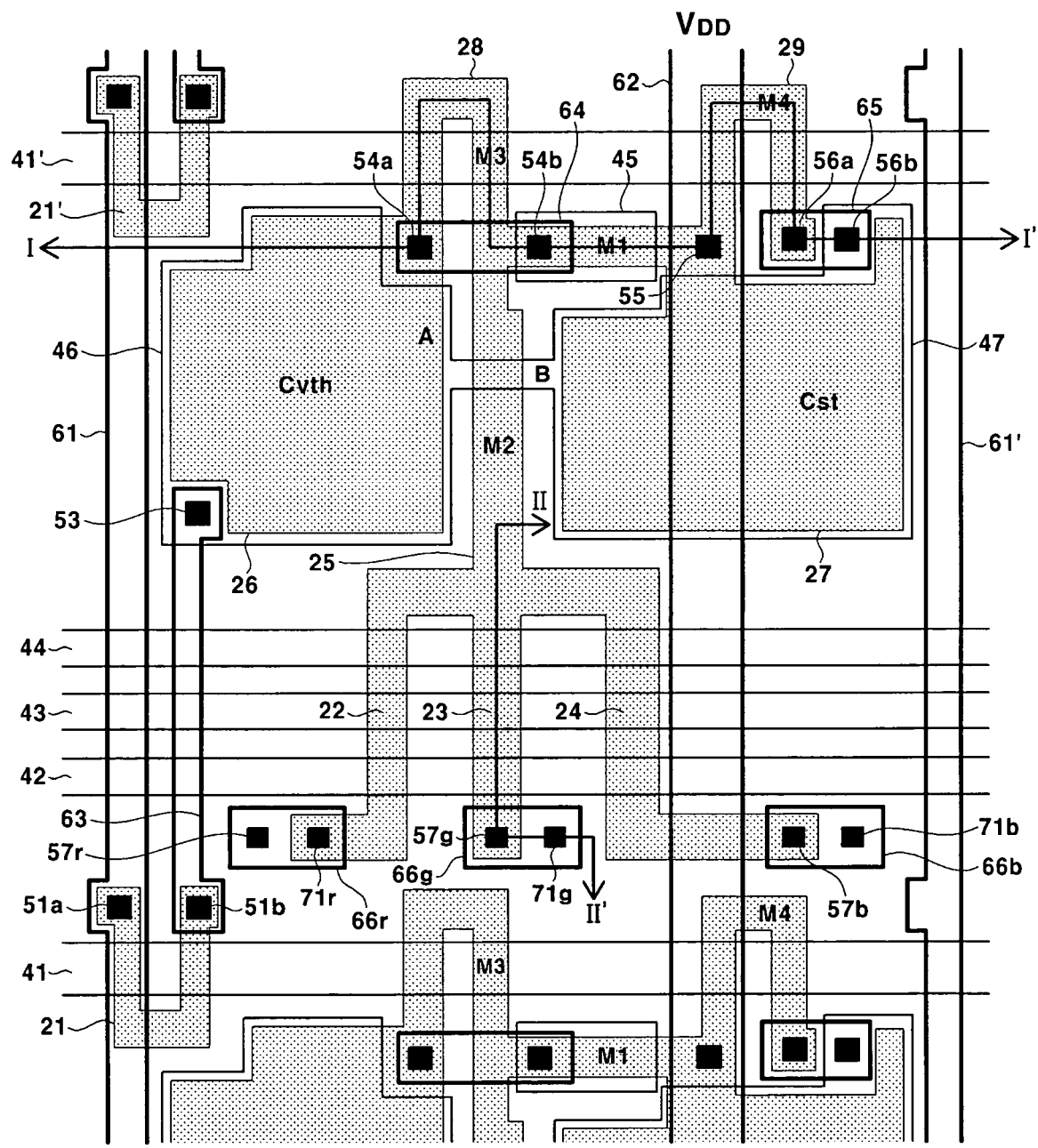
FIG. 4 is an arrangement diagram of a pixel circuit according to a first exemplary embodiment of the present invention.

FIG. 4 is an arrangement diagram of a pixel area in which the pixel circuit shown in FIG. 3 is arranged, according to the first exemplary embodiment of the present invention. FIG. 5 is a cross-sectional view taken along I-I' in FIG. 4. FIG. 6 is a cross-sectional view taken along II-II' in FIG. 4.

Figure 5:
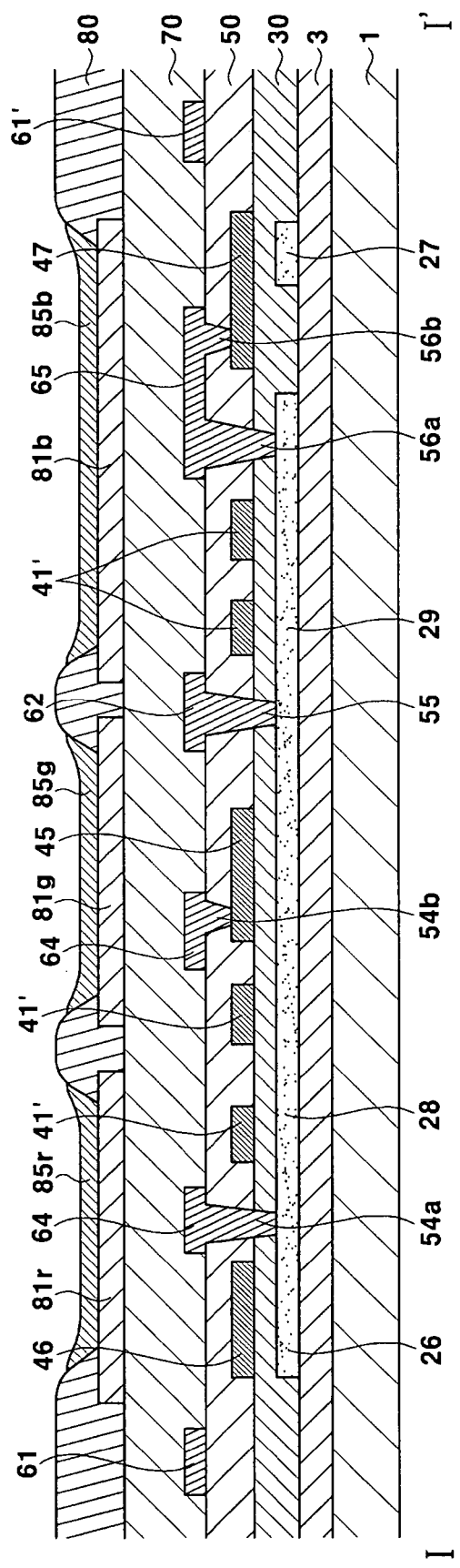
FIG. 5 is a cross-sectional view taken along I-I' in FIG. 4.
Figure 6:
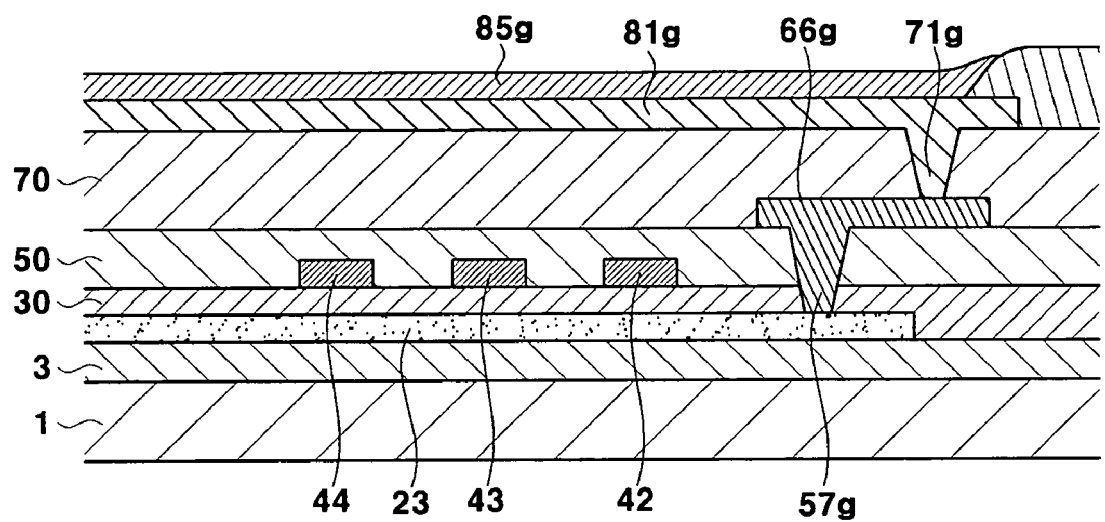
FIG. 6 is a cross-sectional view taken along II-II' in FIG. 4.

First, as shown in FIG. 4, FIG. 5, and FIG. 6, a cut off layer 3 is formed on an insulated substrate 1. The cut off layer 3 is composed of material such as silicon oxide, or the like. Polysilicon layers 21, 22, 23, 24, 25, 26, 27, 28, and 29 that are semiconductor layers are formed on the cut off layer 3.

The polysilicon layer 21 forms a semiconductor layer including a source area, a drain area, and a channel area of the transistor M5 in the present pixel Pk, of which shape resembles the letter 'U'. The polysilicon layer 22 forms a semiconductor layer including a source area, a drain area and a channel area of the transistor M2r in the present pixel Pk, of which shape resembles the shape '⌐'. The polysilicon layer 23 forms a semiconductor layer including a source area, a drain area, and a channel area of the transistor M2g in the present pixel Pk, which is arranged in the column direction. The polysilicon layer 24 forms a semiconductor layer including the source area, the drain area and the channel area of the transistor M2b in the present pixel Pk, of which shape resembles the shape '⌐'. The polysilicon layers 22, 23, and 24 are coupled to form a shape of the letter 'm'. The polysilicon layer 22 is located at the left side of the polysilicon layer 23, and the polysilicon layer 24 is located at the right side of the polysilicon layer 23. The polysilicon layer 22 is generally symmetrical with the polysilicon layer 24 with respect to the polysilicon layer 23.

The polysilicon layer 25 is located at or about the middle of the pixel area and is arranged in the column direction, and the bottom end of the polysilicon layer 25 is coupled to the polysilicon layers 22, 23, and 24. The polysilicon layer 26 is located at the left side of the polysilicon layer 25, and the polysilicon layer 27 is located at the right side of the polysilicon layer 25. The polysilicon layer 26 is generally symmetrical with the polysilicon layer 27 with respect to the polysilicon layer 25. The polysilicon layer 26 generally has a shape of a square and forms a second electrode (node A) of the capacitor Cvth, and the polysilicon layer 27, which generally has a shape of a rectangle, forms a first electrode of the capacitor Cst. The polysilicon layer 28 has a shape of the letter 'n', and one end of the polysilicon layer 28 is coupled to the polysilicon layer 26 and other end of the polysilicon layer 28 is coupled to the polysilicon layer 25 and forms the source, drain, and channel area of the transistor M3. The polysilicon layer 29 has a shape of the letter 'n', and one end of the polysilicon layer 29 is coupled to the polysilicon layer 28 and forms the channel area and drain area of the transistor M1, and the source area, channel area, and drain area of the transistor M4.

A gate insulating film 30 is formed on the polysilicon layers 21 to 29.

The gates 41, 42, 43, 44, 45, 46, and 47 are formed on the gate insulating film 30. In detail, the gate line 41 is arranged in the row direction, and corresponds to the present scan line Sk of the present pixel Pk, and the gate line 41 is insulated and crosses the polysilicon layer 21 to form the gate of the transistor M5 in the present pixel Pk. The gate line 42 is arranged in the row direction, and corresponds to the emit control line Ekb in the present pixel Pk, to form the gate of the transistor M2b. The gate line 43 is arranged in the row direction, and corresponds to the emit control line Ekg of the present pixel Pk, to form the gate of the transistor M2g. The gate line 44 is arranged in the row direction, and corresponds to the emit control line Ekr of the present pixel Pk, to form the gate of the transistor M2r. The gate line 45 is insulated and crosses the polysilicon layer 26 to form the gate of the transistor M1. The gate 46, which generally has a shape of a square, is arranged on the polysilicon layer 26 to form the first electrode (node B) of the capacitor Cvth. The gate 47, which generally has a shape of a rectangle, is arranged on the polysilicon layer 27 to form the second electrode (node B) of the capacitor Cst.

The gate line 41' is arranged in the row direction; it corresponds to the previous scan line Sk-1 of the previous pixel Pk-1, and is insulated and crosses the polysilicon layer 21' to form the gate of the transistor M5 of the previous pixel Pk-1. Further, the gate line 41' is insulated and crosses the polysilicon layers 28 and 29 to form gates of the transistors M3 and M4 of the present pixel Pk.

The layer insulating film 50 is formed on the gates 41, 42, 43, 44, 45, 46, and 47. A data line 61, a power line 62, and electrodes 63, 64, 65, 66r, 66g, and 66b are formed on the layer insulating film 50, such that the data line 61, the power line 62, and the electrodes 63, 64, 65, 66r, 66g, and 66b are contacted to the corresponding electrodes through contact holes 51a, 51b, 53, 54a, 54b, 55, 56a, 56b, 57r, 57g, and 57b.

The data line 61 is arranged in the column direction between two pixel areas and is coupled to the polysilicon layer 21 through the contact hole 51a such that the data line 61 is coupled to the source of the transistor M5. The contact hole 51a passes through the layer insulating film 50 and the gate insulating film 30.

The power supply source line 62 is arranged in the column direction and is coupled to the polysilicon layers 27 and 29 through the contact hole 55 such that the power supply source line 62 supplies power to the first electrode of the capacitor Cst and the source of the transistor M1. The contact hole 55 passes through the layer insulating film 50 and the gate insulating film 30.

The electrode 63 is close to the data line 61, is substantially parallel with the data line 61, and couples the drain area of the polysilicon layer 21 to the gate 46 through the contact hole 51b penetrating the layer insulating film 50 and the gate insulating film 30, and the contact hole 53 penetrating the layer insulating film 50. The electrode 63 becomes the node B.

The electrode 64 is close to the gate 41', is substantially parallel with the gate 41', and couples the drain area to the gate 45 of the transistor M3 in the polysilicon layer 28 through the contact hole 54a penetrating the layer insulating film 50 and the gate insulating film 30, and the contact hole 54b penetrating the layer insulating film 50. The electrode 64 becomes the node A.

The electrode 65, which substantially has a shape of a rectangle, is close to the gate 41' and couples the drain area to the gate 47 of the transistor M4 in the polysilicon layer 29 through the contact hole 56a penetrating the layer insulating film 50 and the gate insulating film 30, and the contact hole 56b penetrating the layer insulating film 50. The electrode 65 becomes the node B.

The electrodes 66r, 66g, and 66b respectively couple the pixel electrodes 81r, 81g, and 81b of each emit element to the drains of the transistors M2r, M2g, and M2b. In the electrodes 66r, 66g, and 66b, each of which substantially has a shape of a rectangle, their row directions are longer than their column directions. Here, the data line 62 is arranged in the column line, and the gates 42 to 44 are arranged in the row direction. The electrodes 66r, 66g, and 66b are respectively coupled to the polysilicon layers 22, 23, and 24 through the contact holes 57r, 57g, and 57b penetrating the gate insulating film 30 and the layer insulating film 50, and are coupled to the drains of the transistors M2r, M2g, and M2b.

A flatting film 70 is formed on the electrodes 63, 64, 65, 66r, 66g, and 66. The pixel electrodes 81r, 81g, and 81b are respectively coupled to the electrodes 66r, 66g, and 66b through the contact holes 71r, 71g, and 71b. In FIG. 5 and FIG. 6, the poly layer structure of red, green, and blue organic films 85r, 85g, and 85b including an emitting layer (EML), an electron transporting layer (ETL), and a hole transporting layer (HTL) are formed on the pixel electrodes 81r, 81g, and 81b.

As such, the polysilicon layers 22, 23, and 24 forming the emit control transistor are coupled to each other. The polysilicon layer 23 forms the emit control transistor M2g of the organic EL element located in the middle of the three organic EL elements. The polysilicon layer 22 forms the emit control transistor M2r of the organic EL element located in the left side of the three organic EL elements. The polysilicon layer 24 forms the emit control transistor M2b of the organic EL element located in the right side of the three organic EL elements. The polysilicon layer 22 is arranged generally symmetrically with the polysilicon layer 24 with respect to the polysilicon layer 23. Thus, the elements including the driving transistor M1 and n channel emit control transistors M2r, M2g, and M2b can be efficiently arranged at the pixel area, while the inner resistances of the polysilicon layers are substantially constantly maintained.

Next, the arrangement structure of the pixel area according to a second exemplary embodiment of the present invention is described in detail with reference to FIG. 7.

The second exemplary embodiment of the present invention is different from the first exemplary embodiment in that each of polysilicon layers 122, 123, and 124 for respectively forming emit control transistors M2r, M2g, and M2b, has a substantially constant ratio of length and width such that the emit control transistors M2r, M2g, and M2b have similar or substantially the same inner resistances. Hereinafter, the components of the second exemplary embodiment of FIG. 7 that are different from the corresponding components of the first exemplary embodiment of FIG. 4 will be described.

Figure 7:
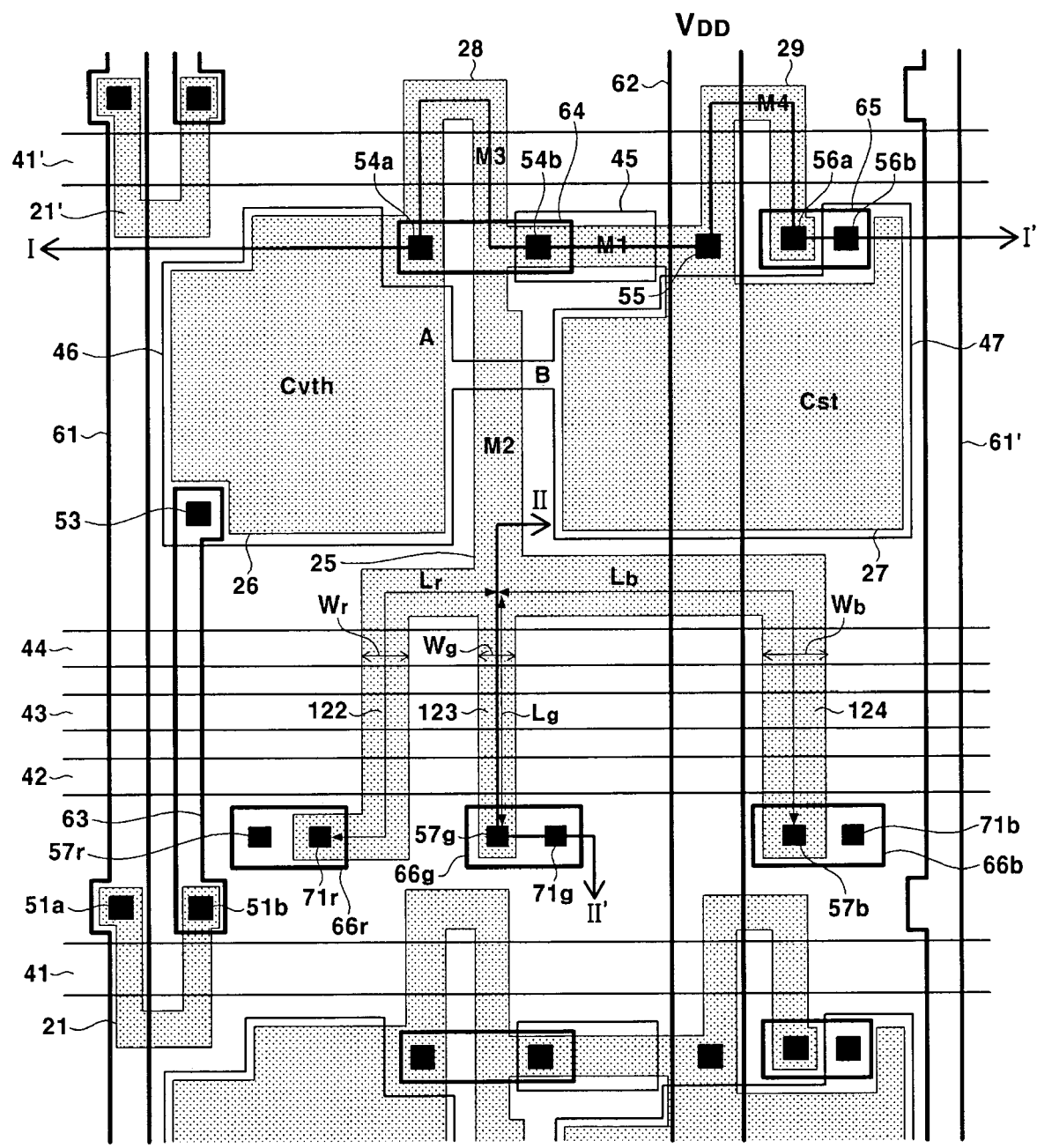
FIG. 7 is an arrangement diagram of a pixel circuit according to a second exemplary embodiment of the present invention.

As shown in FIG. 7, the polysilicon layer 122 has length Lr and width Wr, the polysilicon layer 123 has length Lg and width Wg, and the polysilicon layer 124 has length Lb and width Wb.

Generally, the inner resistance of the polysilicon layer can be calculated as given in the following Equation 5.

$$R = R_S \times \frac{L}{W} \quad \text{[Equation 5]}$$

Here, the R is the inner resistance of the polysilicon layer, L is the length of the polysilicon layer, that is, the sum of the lengths of the source area, the channel area, and the drain area, and W is the width of the polysilicon layer in a direction that is substantially perpendicular to the direction in which the length is measured. Further, Rs is a plane resistance, which is a resistance of the polysilicon layer having the unit width W and unit length L. By way of example, the plane resistance may have a value of 5 Ω/plane.

In this case, each inner resistance of each polysilicon layer 122, 123, and 124 depends on each of Lr/Wr, Lg/Wg, and Lb/Wb. Thus, the polysilicon layers 122, 123, and 124 have correlation such as given in the following Equation 6, such that the inner resistances R of each polysilicon layer 122, 123, and 124 have similar or substantially the same values.

$$\frac{Lr}{Wr} = \frac{Lg}{Wg} = \frac{Lb}{Wb} \quad \text{[Equation 6]}$$

As such, the properties of the emit control transistors M2r, M2g, and M2b can be substantially constantly maintained by using the polysilicon layers 122, 123, and 124 having substantially the same ratio of (or between) the length and the width.

As such, the properties of the emit control transistors M2r, M2g and M2b can be established to be substantially the same as each other by using the polysilicon layers 122, 123, and 124 having substantially the same ratio of length and width, such that the current $I_{OLED}$ transmitted through the emit control transistors M2r, M2g, and M2b can be substantially constantly maintained.

According to exemplary embodiments of the present invention, when one pixel area includes three organic EL elements, and each emit control transistor is coupled between the drain of the driving transistor and the corresponding organic EL element, polysilicon layers forming the emit control transistors are coupled to be one body. Further, when the polysilicon layer forming the emit control transistor of the organic EL element which is located in the middle of the three organic EL elements, is located in the middle, the polysilicon layer which is located at the left side of the three organic EL elements is arranged generally symmetrically with the polysilicon layer which is located at the right side of the three organic EL elements with respect to the polysilicon layer which is located in the middle. Further, the emit control transistors can have substantially the same properties by using the polysilicon layers having substantially the same ratio of length and width.

As such, each element is more efficiently arranged at the small pixel area, while the inner resistances of the polysilicon layers forming the emit control transistors are substantially constantly maintained. Further, the emit control transistors have substantially the same current transmitting properties, and thus the current outputted from the driving transistor can be substantially stably transmitted to the corresponding emit elements.

While the present invention has been described in connection with certain exemplary embodiments, it is to be understood by those skilled in the art that the invention is not limited to the disclosed embodiments, but, on the contrary, is intended to cover various modifications and equivalent arrangements included within the spirit and scope of the appended claims.

What is claimed is:

1. A display device comprising a plurality of scan lines for transmitting select signals, a plurality of data lines for transmitting data signals, and a plurality of pixel circuits coupled to the scan lines and the data lines, wherein
at least one of the pixel circuits comprises:
a capacitor for charging a voltage which corresponds to one of the data signals transmitted from a corresponding one of the data lines;
a driving transistor for outputting a current corresponding to the voltage charged in the capacitor;
a plurality of emit elements for emitting a light corresponding to the current outputted from the driving transistor; and
a plurality of emit control transistors coupled between the driving transistor and the plurality of emit elements,
wherein the emit control transistors comprise a plurality of semiconductor layers having inner resistances that are substantially the same as each other, wherein a length of a first semiconductor layer of the plurality of semiconductor layers is different than a length of a second semiconductor layer of the plurality of semiconductor layers, and wherein each of the inner resistances corresponds to a ratio of a length and a width of a respective one of the semiconductor layers.

2. The display device of claim 1, wherein the ratio of the length and the width of each of the semiconductor layers is substantially the same as those of other ones of the semiconductor layers.

3. The display device of claim 2, wherein two emit elements among the plurality of emit elements respectively emit one light among a red light, a green light, and a blue light, in response to the current outputted from the driving transistor.

4. The display device of claim 3, wherein the length of each of the semiconductor layers forming a corresponding one of the emit control transistors includes a length of a source area, a length of a channel area, and a length of a drain area of the corresponding one of the emit control transistors.

5. The display device of claim 2, wherein at least two semiconductor layers among the plurality of semiconductor layers are substantially parallel to each other.

6. A display device comprising a plurality of scan lines for transmitting select signals, a plurality of data lines for transmitting data signals, and a plurality of pixel circuits coupled to the scan lines and the data lines, wherein
at least one of the pixel circuits comprises:
a capacitor for charging a voltage which corresponds to one of the data signals transmitted from a corresponding one of the data lines;
a driving transistor for outputting a current corresponding to the voltage charged in the capacitor;
a plurality of emit elements for emitting a light corresponding to the current outputted from the driving transistor; and
a plurality of emit control transistors coupled between the driving transistor and the plurality of emit elements,
wherein the emit control transistors comprise a plurality of semiconductor layers having inner resistances that are substantially the same as each other, wherein each of the inner resistances corresponds to a ratio of a length and a width of a respective one of the semiconductor layers; and
wherein the width of each of the semiconductor layers forming the corresponding one of the emit control transistors is measured in a direction that is substantially perpendicular to a direction in which the length of the semiconductor layer is measured.

7. A display device comprising a plurality of scan lines for transmitting select signals, a plurality of data lines for transmitting data signals, and a plurality of pixel circuits coupled to the scan lines and the data lines, wherein
at least one of the pixel circuits arranged in a pixel area comprises:
first, second, and third emit elements comprising pixel electrodes to which a current is applied, for emitting light corresponding to the applied current; and
first, second, and third semiconductor layers respectively coupled to pixel electrodes of the first, second, and third emit elements through first, second, and third contact holes; and
first, second, and third control electrode lines being insulated and crossing the first, second, and third semiconductor layers and being substantially parallel to each other,
wherein ratios of a length and a width of the first semiconductor layer, the second semiconductor layer, and the third semiconductor layer are substantially the same as each other.

8. The display device of claim 7, wherein the first semiconductor layer forms a first emit control transistor having an insulated channel area which crosses the first control electrode line;
the second semiconductor layer forms a second emit control transistor having an insulated channel area which crosses the second control electrode line; and
the third semiconductor layer forms a third emit control transistor having an insulated channel area which crosses the third control electrode line.

9. The display device of claim 8, wherein the length of each of the first, second, and third semiconductor layers includes a length of a source area, a length of the channel area, and a length of a drain area of a corresponding one of the first, second, and third emit control transistors.

10. The display device of claim 9, wherein the width of each of the first, second, and third semiconductor layers is measured in a direction substantially perpendicular to a direction in which the length of the corresponding one of the first, second, and third semiconductor layers is measured.

11. A display device comprising a plurality of scan lines for transmitting select signals, a plurality of data lines for transmitting data signals, and a plurality of pixel circuits coupled to the scan lines and the data lines, wherein
at least one of the pixel circuits comprises:
a first capacitor for charging a voltage which corresponds to one of the data signals transmitted from a corresponding one of the data lines;
a first transistor for outputting a current which corresponds to the voltage charged in the first capacitor;
first, second, and third emit elements for emitting a light corresponding to the current outputted from the first transistor; and
first, second, and third emit control transistors respectively coupled between the first transistor and the first, second, and third emit elements,
wherein a first semiconductor layer forming the first emit control transistor is arranged generally symmetrically with a second semiconductor layer forming the second emit control transistor with respect to a third semiconductor layer forming the third emit control transistor.

12. The display device of claim 11, wherein at least two semiconductor layers among the first, second, and third semiconductor layers are substantially parallel to each other.

13. The display device of claim 12, wherein the first, second, and third semiconductor layers forming the first, second, and third emit control transistors are doped with the same type of impurities.

14. The display device of claim 11, wherein the at least one of the pixel circuits further comprises:
a second transistor coupled between a control electrode of the first transistor and a node between the first transistor and the first, second and third emit control transistors; a third transistor having a first electrode coupled to a first electrode of the first capacitor and a second electrode coupled to a second electrode of the first capacitor; and
a second capacitor having a first electrode coupled to the second electrode of the third transistor and a second electrode coupled to the control electrode of the first transistor.

15. A display device comprising a plurality of scan lines for transmitting select signals, a plurality of data lines for transmitting data signals, and a plurality of pixel circuits coupled to the scan lines and the data lines and arranged in an array format, wherein
at least one of the pixel circuits arranged in a pixel area comprises:
first, second, and third emit elements comprising pixel electrodes to which a current is applied, for emitting light corresponding to the applied current;
semiconductor layers comprising a first semiconductor layer area coupled to a pixel electrode of the first emit element through a first contact hole, a second semiconductor layer area coupled to a pixel electrode of the second emit element through a second contact hole, and a third semiconductor layer area coupled to a pixel electrode of the third emit element through a third contact hole; and first, second, and third control electrode lines which are insulated and cross the semiconductor layers and are substantially parallel to each other, wherein the first semiconductor layer area is arranged generally symmetrically with the third semiconductor layer area with respect to the second semiconductor layer area.

16. The display device of claim 15, wherein at least one semiconductor layer area among the first, second, and third semiconductor layer areas is substantially parallel to at least one of the data lines.

17. The display device of claim 16, wherein at least one semiconductor layer area among the first, second and third semiconductor layer areas is substantially parallel to at least one of the scan lines.

* * * * *